US008648832B2

(12) United States Patent
Maloof et al.

(10) Patent No.: US 8,648,832 B2
(45) Date of Patent: Feb. 11, 2014

(54) TOUCH SENSOR SYSTEM AND METHOD

(75) Inventors: Jim Maloof, Westwood, MA (US); Robert Shamitz, Quincy, MA (US)

(73) Assignee: Stoneridge Control Devices, Inc., Canton, MA (US)

( * ) Notice: Subject to any disclaimer, the term of this patent is extended or adjusted under 35 U.S.C. 154(b) by 1004 days.

(21) Appl. No.: 12/567,587

(22) Filed: Sep. 25, 2009

(65) Prior Publication Data
US 2010/0079153 A1 Apr. 1, 2010

Related U.S. Application Data

(60) Provisional application No. 61/100,259, filed on Sep. 25, 2008.

(51) Int. Cl.
*G06F 3/045* (2006.01)
(52) U.S. Cl.
USPC ...... 345/174; 345/173; 178/18.05; 178/18.06
(58) Field of Classification Search
USPC .......................................................... 345/173
See application file for complete search history.

(56) References Cited

U.S. PATENT DOCUMENTS

| | | | | |
|---|---|---|---|---|
| 4,508,990 A * | 4/1985 | Essinger | .......................... | 313/50 |
| 6,242,076 B1 * | 6/2001 | Andriash | ...................... | 428/138 |
| 6,341,227 B1 * | 1/2002 | Moster et al. | ............... | 455/550.1 |
| 6,728,166 B2 * | 4/2004 | Grupp | .............................. | 368/69 |
| 2006/0177212 A1 | 8/2006 | Lamborghini | | |
| 2006/0238385 A1 * | 10/2006 | Steenwyk et al. | ............... | 341/33 |
| 2006/0238513 A1 * | 10/2006 | Philipp | .......................... | 345/173 |
| 2007/0295043 A1 * | 12/2007 | McDermott et al. | ............ | 70/255 |
| 2008/0257706 A1 * | 10/2008 | Haag | ............................. | 200/600 |
| 2009/0051660 A1 * | 2/2009 | Feland et al. | .................. | 345/173 |

FOREIGN PATENT DOCUMENTS

WO 2006066097 6/2006

* cited by examiner

*Primary Examiner* — Lixi C Simpson
(74) *Attorney, Agent, or Firm* — Grossman, Tucker, Perreault & Pfleger, PLLC

(57) ABSTRACT

A touch sensor assembly may include a cover, an electrode film assembly, an adhesive layer, a printed circuit board (PCB) electrically connected to the electrode film and a back plate configured to be coupled to the cover with the PCB and the electrode film assembly disposed between the housing and the back plate. The electrode film assembly may include an electrode film formed from a conductive ink and may comprise a plurality of contacts corresponding to a plurality of touch areas. The electrode film assembly may optionally comprise capacitive circuitry configured to exhibit a capacitance response to contact with the touch areas. The adhesive layer may be configured to secure the electrode film assembly to the cover. The PCB may be substantially planar and the cover may include an inner surface having a curvature. The electrode film may be configured to substantially conform to the curvature when secured thereto.

22 Claims, 13 Drawing Sheets

TOUCH SENSOR SYSTEM AND METHOD

CROSS-REFERENCE TO RELATED APPLICATIONS

This application claims the benefit 61/100,259 field Sep. 25, 2008 and titled Touch Sensor System and Method, which is fully incorporated herein by reference.

TECHNICAL FIELD

This disclosure relates to touch sensor systems and methods.

BACKGROUND

A vehicle may include assemblies for controlling activation or deactivation of a device. The automotive industry has required that such devices provide tactile feedback to a user to indicate when a function has been activated or deactivated. Tactile feedback may be achieved using associated mechanical components, such as a spring and lever in an "over the center" snap-acting arrangement (e.g. in a rocker mechanism), or by the use of other known tactile feedback configurations.

These configurations typically require several components and features. Some of the components may be difficult and expensive to manufacture. For example, a pivot race and pivot shaft for a rocker button may have narrow tolerances and require a highly polished surface to reduce frictional forces. Conventional assemblies may thus involve complex design, high costs, and reduced reliability. In addition, consumer preferences are leading automobile manufacturers to more streamlined and unobtrusive systems.

At least in part to address these issues, touch sensor configurations have been adopted. As used herein the term "touch sensor" refers to a sensor configuration that provides an output in response to contact with a touch area without requiring movement of a mechanical component to electrically close or open associated contacts. Numerous analog and digital touch sensor configurations are well-known to those of ordinary skill in the art. Known touch sensors use techniques such as resistive sensing, capacitive sensing, acoustic sensing, magnetic sensing, optical sensing, etc., to providing an output in response to contact with a touch area.

Touch sensor configurations may be less expensive compared conventional mechanical switch devices, may require less space for installation, and may be more aesthetically pleasing. However, in multiple sensor configurations crosstalk between adjacent touch sensors may prevent or delay proper system operation, and conventional touch sensor systems may be challenged by harsh environmental conditions, e.g. rain, ice, extreme temperature, vibration, etc.

BRIEF DESCRIPTION OF THE DRAWINGS

Features and advantages of embodiments of the disclosed subject matter will become apparent as the following Detailed Description proceeds, and upon reference to the Drawings, where like numerals depict like parts, and in which.

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Embodiments presented herein are described with reference to an automotive application. It is to be understood, however, that the embodiments described herein are presented by way of illustration, not of limitation. For example, a touch sensor system consistent with the present invention may be used in any of a variety of systems, e.g. in consumer and industrial equipment or appliances, for enabling a user input to switch or control functions and/or to input data.

Figure 1:
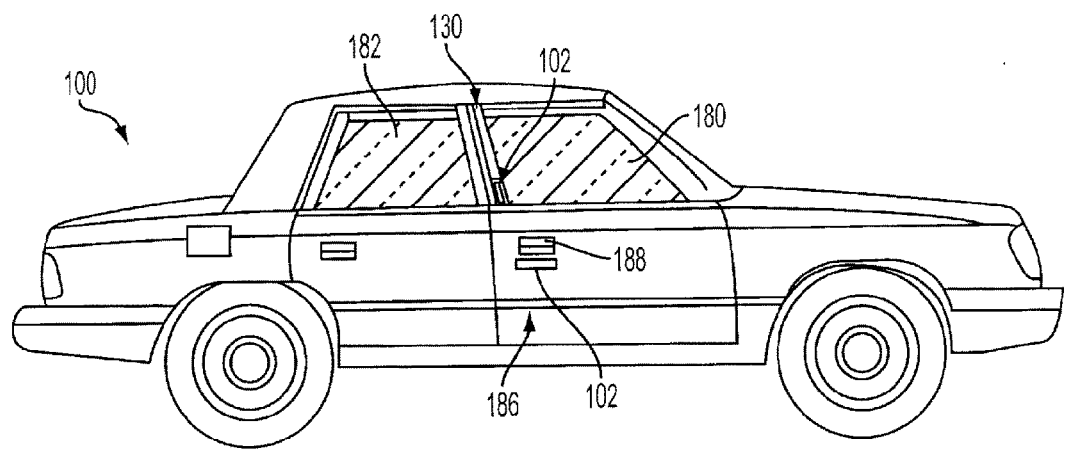
FIG. 1 is a perspective view of a vehicle incorporating touch sensor assemblies consistent with the present disclosure.
Figure 2:
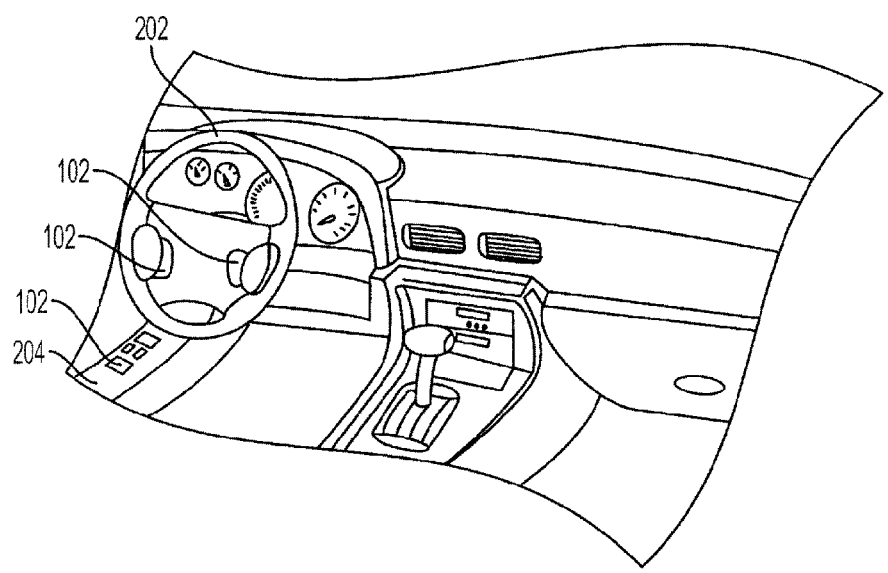
FIG. 2 is a partial view of the interior cabin area of the vehicle of FIG. 1.

FIGS. 1 and 2 illustrate a touch sensor assembly 102 consistent with the present disclosure utilized at the exterior and interior of a vehicle 100. A touch sensor assembly 102 consistent with the present disclosure may, for example, be provided as a user interface portion of a keyless vehicle entry system. Keyless entry systems are well-known and generally allow a user to unlock a door, e.g. a vehicle or building door, open/close a window/sunroof, trunk, or the like by entering a code on a user interface associated with the door. An output of the user interface may be provided to a controller configured to unlock the associated door upon entry of a predefined code at the user interface. In vehicle entry system, a touch sensor assembly 102 consistent with the present disclosure may be affixed on or proximate the B-pillar area 130 of the vehicle, as shown in FIG. 1. In addition, or alternatively, a touch sensor assembly 102 consistent with the present disclosure may be located on the front door 186 proximate a door handle 188. As shown in FIG. 2, one or more touch sensors 102 may be located on a vehicle steering wheel 202 and/or on the inside arm rest portion 204 of the driver's side door. A touch sensor 102 consistent with the present disclosure may also be provided on a surface of the instrument panel.

Figure 3:
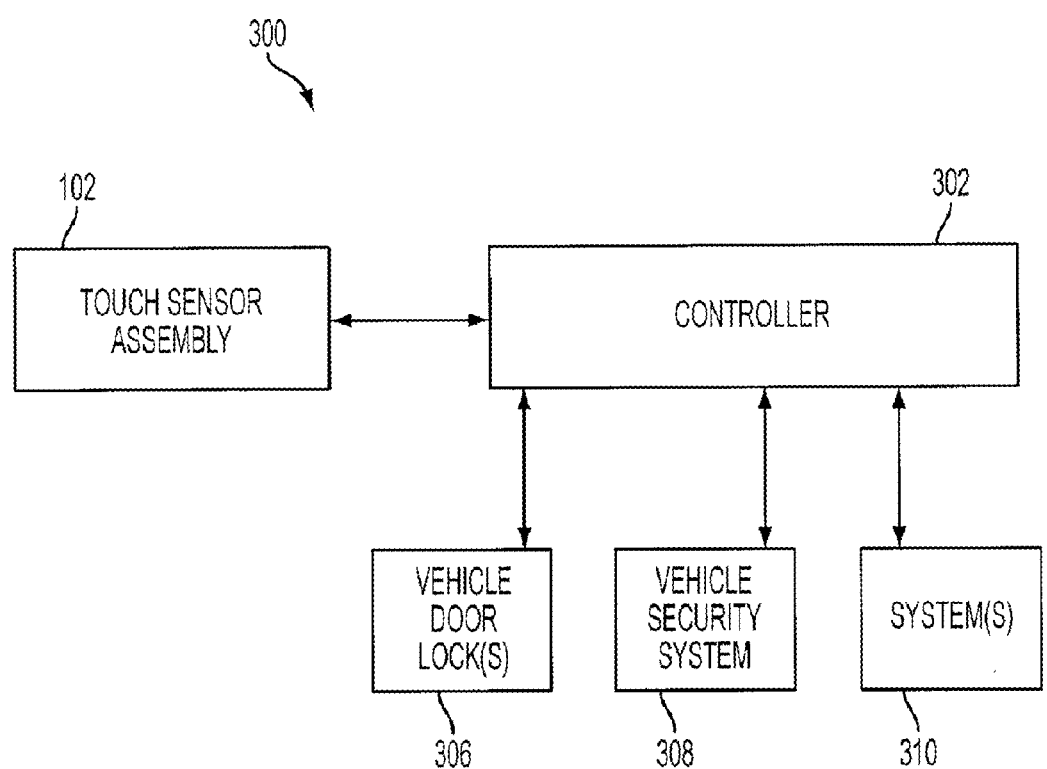
FIG. 3 is a block diagram of a touch sensor system that may be utilized in the vehicle of FIG. 1.

FIG. 3 illustrates in block diagram form one exemplary embodiment of a touch sensor system 300 including a touch sensor assembly 102, a controller 302, and one or more vehicle systems 306, 308, 310 coupled to the controller 302. The touch sensor assembly 102 may include one or more known touch sensors, e.g. employing resistive sensing, capacitive sensing, acoustic sensing, magnetic sensing, optical sensing, etc., to provide an output in response to contact with a touch area. Combinations of touch sensors may be used to provide redundancy.

In operation, a user may cause contact, either directly or indirectly, with one or more of the touch areas, causing the assembly 102 to provide an associated output. The output of the assembly 102 may be coupled, e.g. via a vehicle CAN bus, to the controller 302. The controller may be responsive to the output to control one or more systems, e.g. vehicle door lock(s), vehicle security system 308, and/or another system 310, such as a vehicle sound system, climate control system, etc. For example, in an embodiment wherein the touch sensor system 300 is configured as a vehicle entry system, the controller 315 may be responsive to signals from the assembly 102 to control the vehicle door locks 305 to lock or unlock one or more doors.

Figure 4:
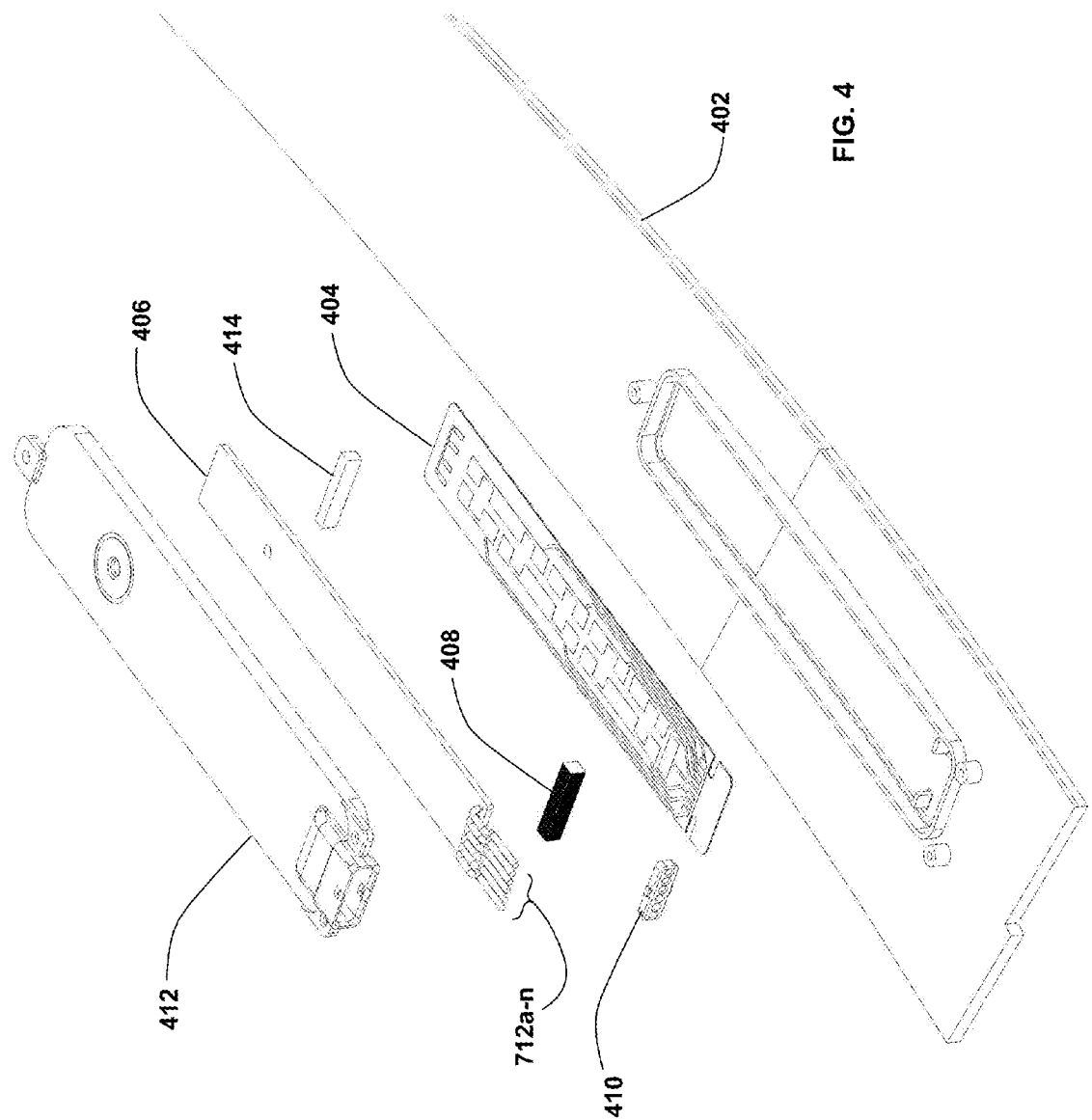
FIG. 4 is a perspective view a touch sensor assembly.

FIG. 4 is an exploded bottom perspective view of one exemplary embodiment of a touch sensor assembly 102 that may be installed at the exterior of a vehicle, e.g., on the B-pillar or adjacent a door handle as shown in FIG. 1, for use in connection with a vehicle entry system. The touch sensor assembly 102 may include a sensor cover or appliqué 402 visible to a user, a layered electrode film 404, a printed circuit board (PCB) 406 carrying one or more LEDs 702a-n (FIG. 7), an elastomeric connector 408 including conductive fibers for providing electrical contact between electrodes on the electrode film 404 and associated contacts on the PCB 406; a seal 410 for sealing one or more wires 712a-n coupled to the PCB and preventing entry of contaminants into the assembly, and a back plate 412 for coupling to the cover 402 with the electrode film 404, PCB 406, seal 410 and elastomeric connector 408 captured between the cover 402 and back plate 412. The sensor cover 402 may identify a plurality of touch areas, e.g. on a front portion thereof, using alpha-numeric and/or other graphics, as shown and described for example in commonly owned U.S. Patent Application Publication No. US2006/0177212 entitled "Touch Sensor System and Method", the entire teachings of which are hereby incorporated herein by reference. Capacitive touch sensors may be formed by electrodes on the electrode film 404 and each touch sensor 102 may be associated with a corresponding touch area on the cover 402, whereby the sensors provide an output to associated contacts on the PCB 406 through the elastomeric connector 408. The sensor 102 may optionally include one or more supports 414, for example, disposed between the PCB 406 and the electrode film 404. The supports 414 may be include a rubber spacer or the like configured to support the PCB 406 when assembled and reduce vibration and/or movement of the PCB 406 relative to the cover 402 and the back plate 412.

Figure 5:
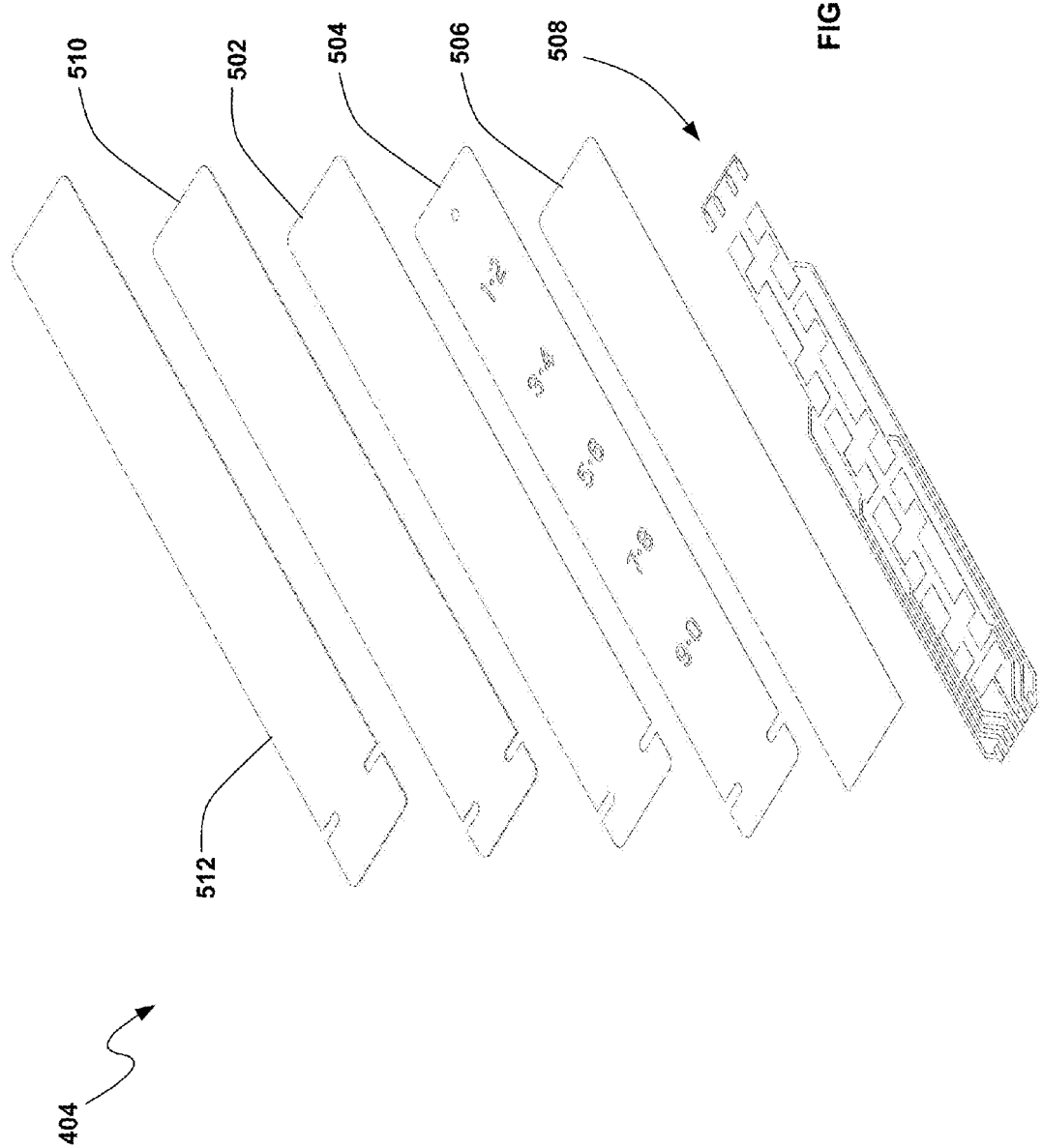
FIG. 5 is an exploded view of the electrode film assembly of FIG. 4.

FIG. 5 is an exploded view of the electrode film 404. As shown, the electrode film assembly 404 includes a transparent (e.g., at least partially translucent) film 502, e.g. of about 0.008" thick in one embodiment. The film 502 may be comprised of a substantially clear Mylar, polyester, Lexan or similar material. One or more indicia layers 504, 506 may be provided. For example, the indicia layers may include a layer of black paint 504 (e.g., with graphics thereon which may correspond to the touch area locations) provided on one side of the film 404, and a layer of white paint 506 provided adjacent to the layer of black paint 504. Of course, the colors and/or number of the indicia layers 504 and 506 may be selected based on the intended application. For example, the indicia layers 504, 506 may be replaced by a single indicia layer having multiple colors or the film 404 or may include three or more colored layers.

An electrode pattern 508 including one or more electrodes corresponding to the touch areas may be provided on one of more of the indicia layers 504, 506 using a transparent or non-transparent conductive ink, e.g. by spraying or the like. Alternatively, the electrode pattern 508 may be provided on another substantially transparent (e.g., translucent) film disposed between the white layer 506 (i.e., the lower layer of the indicia layers 504, 506). The electrode pattern 508 may define electrodes corresponding to the locations of the graphics on the black paint 504 and the touch areas of the sensor. A layer of adhesive 510, e.g. a 3M 200 MP or similar adhesive, may be provided on the opposite side of the film 404 and a removable backing 512 may be provided on the adhesive layer 510. The removable backing 512 may include paper (e.g., but not limited to, paper coated with silicon) and/or plastic configured to prevent inadvertent adhering of the electrode film 404 prior to assembly.

Figure 6:
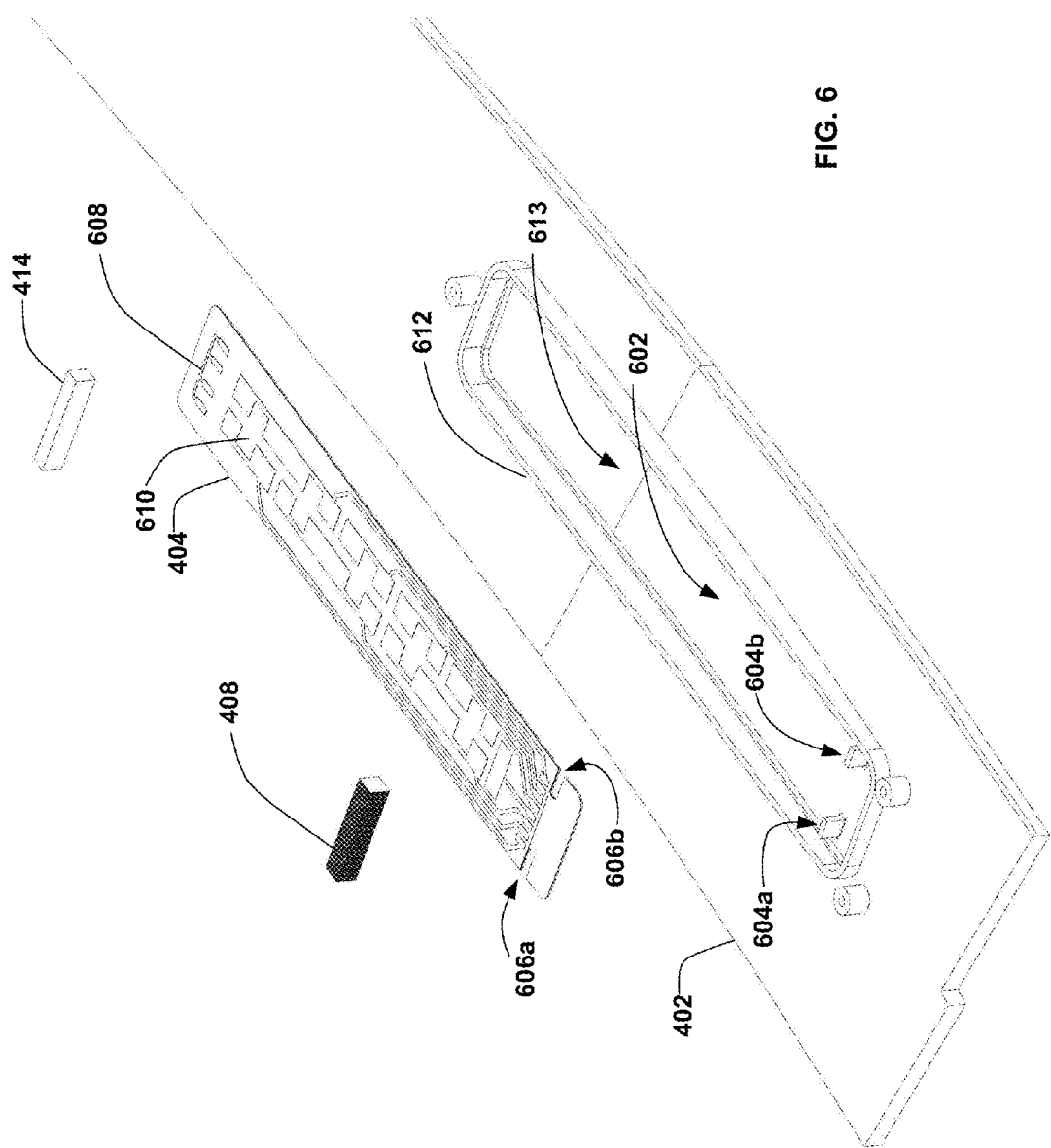
FIG. 6 is an exploded view of the electrode film assembly and the cover.
Figure 8:
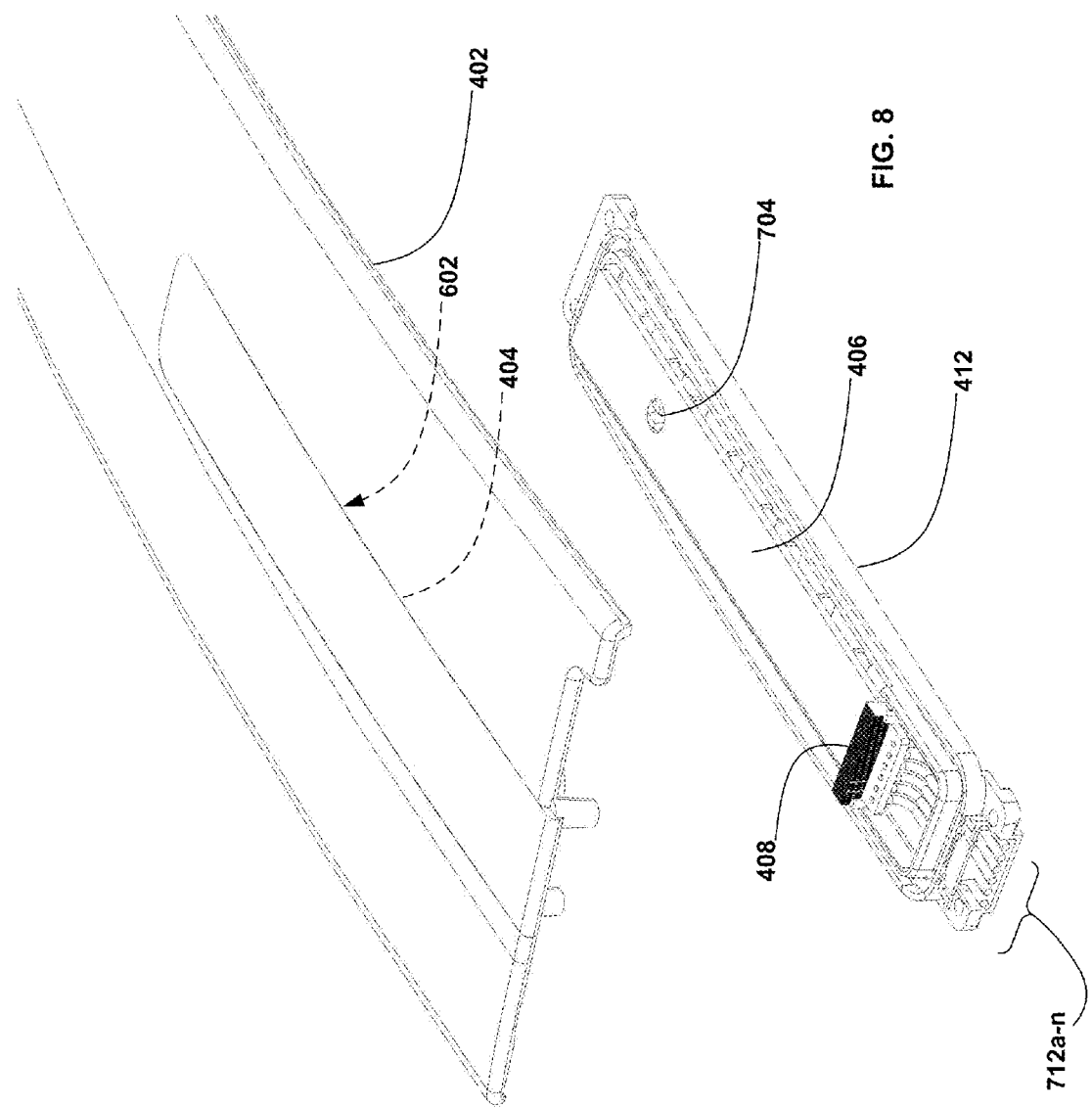
FIG. 8 is a partial, unassembled perspective view of the cover with the electrode film assembly and the back plate with the PCB.

As shown in FIG. 6, upon assembly, the paper backing 512 may be removed to expose the adhesive layer 510 and the adhesive layer 510 may be placed in contact with the cover 402 to adhere the electrode film 404 to the bottom surface 602 of the cover. As show, one or more locator posts 604a-604b may be provided on the back surface 602 of the cover 402 in a location corresponding to one or more locator post openings 606a-606b in the electrode film assembly 404, e.g. formed by associated openings in the film 510, paint 504, 506 and adhesive 502 as illustrated in FIG. 5. During assembly, the locator post openings 606a-606b in the electrode film 404 may be aligned with the locator posts 604a-604b to ensure proper positioning of the electrode film 404 relative to the cover 402 to ensure the electrode film 404 is adhered to the cover 402 in the proper position. The back surface 602 of the cover 402 may optionally include a raised rim or sidewall 612 defining a chamber 613 configured to receive the electrode film 404 and the PCB 606. The sidewall 612 may be configured to sealing engage with the back plate 412 (e.g., as shown in FIG. 8).

With continued reference to FIG. 6, the electrode film assembly 404 may optionally include an anti-swipe electrode 608. The anti-swipe electrode 608 may be provided to prevent inadvertent activation of a locking feature that causes all of the locks in the vehicle to activate. The locking feature may be activated, for example, by pressing both the 9-0 and 7-8 keys simultaneously. If the vehicle is in a car wash, for example, it would be undesirable for the doors to lock due to accidental pressing of those keys by the machinery of the car wash. The anti-swipe electrode 608 may prevent this from happening. In one embodiment, the anti-swipe electrode 608 (which may be about 15 mm by 2 mm) may be placed below/adjacent the 9-0 touch area 610 requiring that pressing the 9-0 key will have to be more deliberate anti-swipe electrode 208 will sense an invalid touch upon contact below/adjacent the 9-0 touch area 610. Any touch sensed by the anti-swipe electrode 608 may be considered an invalid touch that disables the locking feature to prevent inadvertent locking of the vehicle doors.

Figure 7:
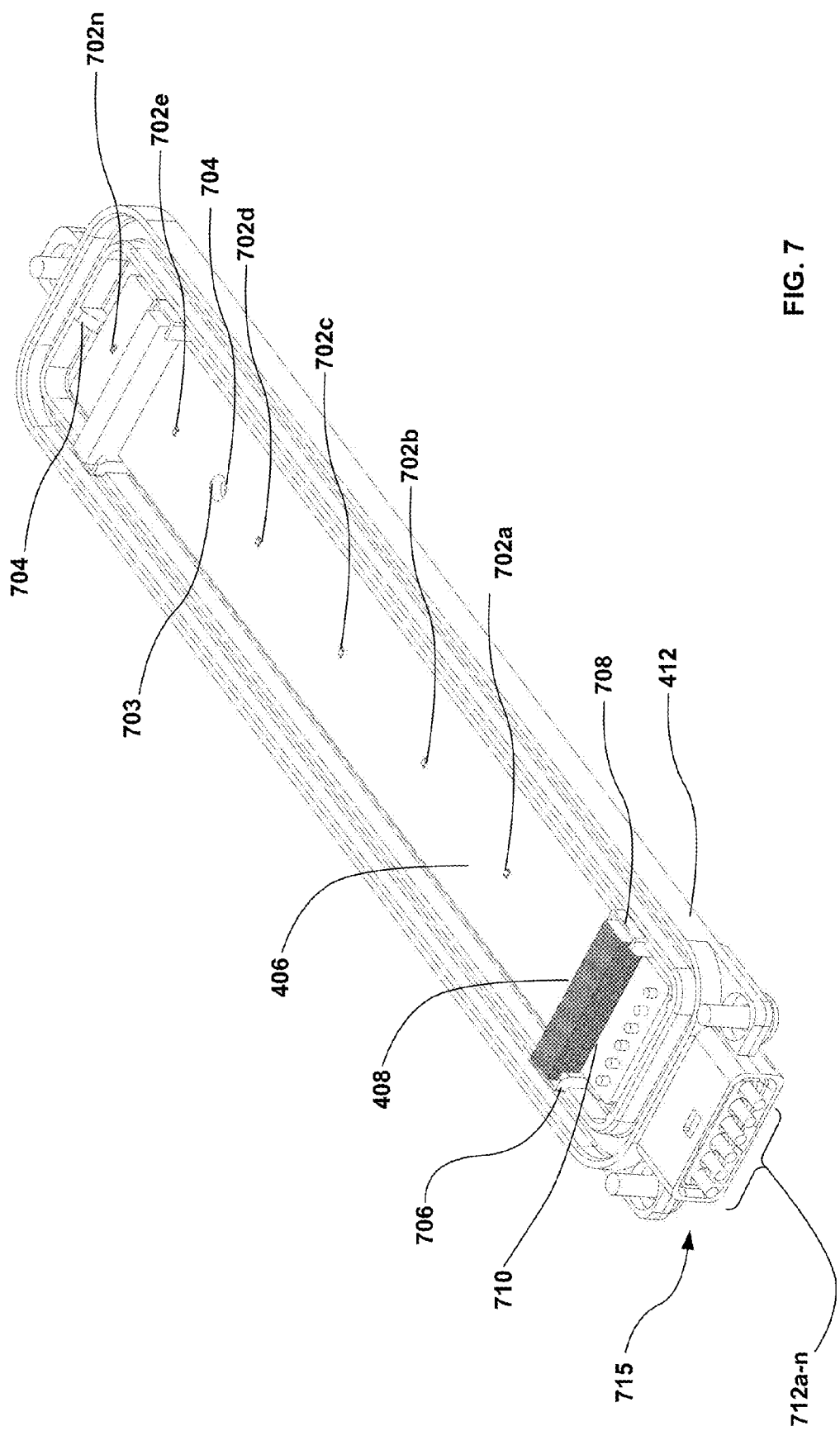
FIG. 7 is perspective view of the printed circuit board (PCB) and the back plate.

As shown in FIG. 7, the PCB 406 may be mounted to the back plate 412, e.g. using one or more snap connection features 704. For example, the snap connection feature 704 may extend from the back plate 412 through an opening 703 in the PCB 406 (e.g., as shown in FIG. 8). Alternatively (or in addition), the snap connection feature 704 may be extend from the back plate 412 and be biased over a portion of the periphery of the PCB 406 (e.g., but not limited to, a distal and/or proximal end of the PCB 406). The PCB may also be held in place using the elastomeric connector 408 and/or one or more supports 414. The elastomeric connector 408 and/or one or more supports 414 may be configured to urge the PCB 406 against the back plate 412 once the back plate 412 is secured to the cover 402.

The elastomeric connector 408 may be mounted in corresponding slots formed by retainers 706, 708 at opposite sides of the cover 412 and may be positioned above contacts 710 on the PCB 406 to provide electrical connection between the contacts 710 on the electrode film 404 and corresponding contacts 710 on the PCB 406. One or more wire leads 712*a-n* may be electrically coupled to the contacts 710 on the PCB 406 and may extend from the PCB 406 and out of the end 715 of the back plate 412. The PCB 406 may also include at least one light source. For example, a plurality of LEDs 702*a-n* may be positioned on the surface of the PCB 406 for emitting light through corresponding ones of the touch areas thereby illuminating the touch areas for visibility. The LEDs 702*a-n* may be powered through current supplied through the wire leads 712*a-n*, e.g. from the vehicle battery, and associated traces on the PCB 406.

Figure 9:
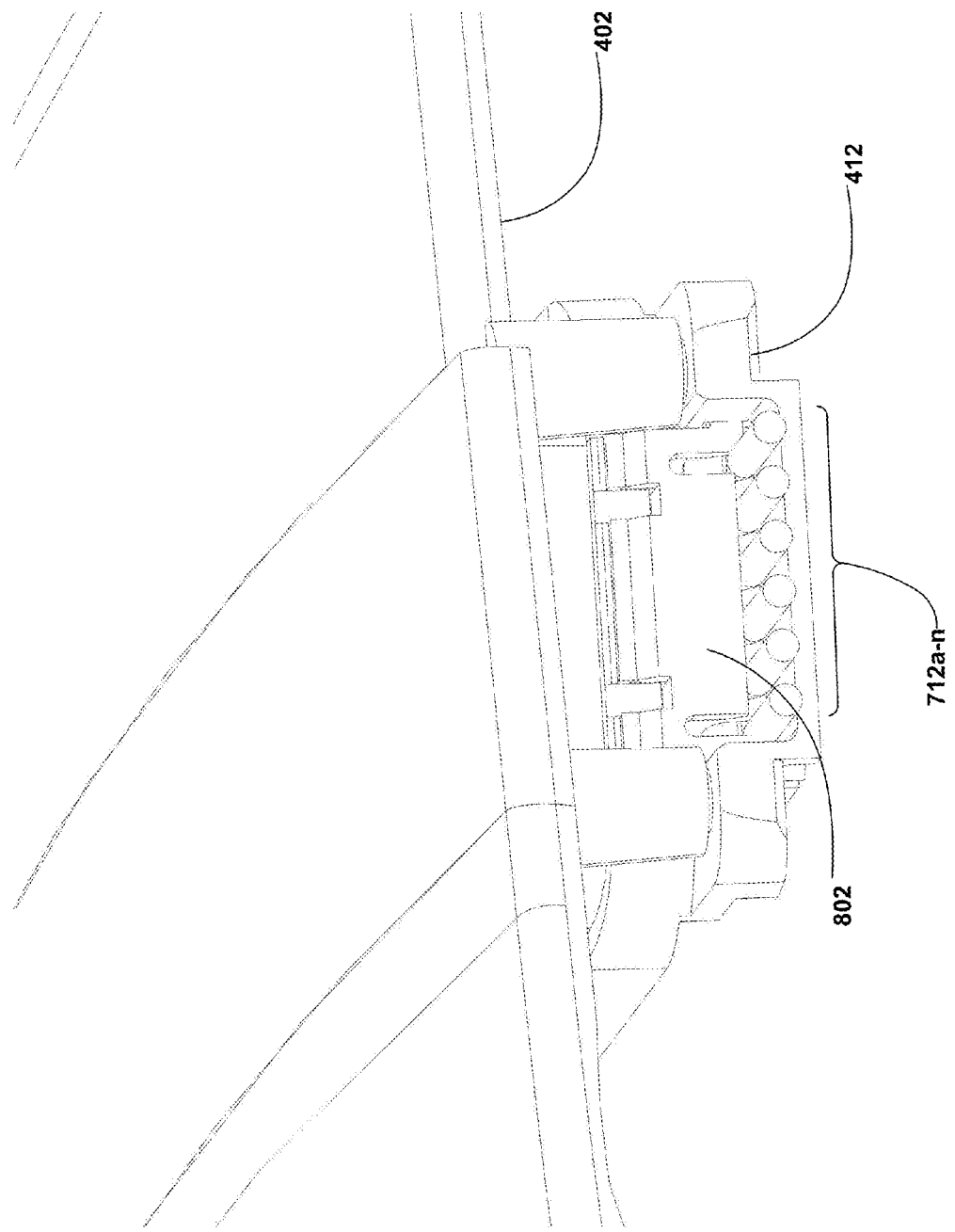
FIG. 9 is an end view of one embodiment of a seal for the plurality of wires coupled to the PCB.

As shown in FIGS. 8 and 9, the back plate 412 may include a folding snap feature 802 that may be folded downward (e.g., from the position shown in FIG. 8 to the position shown in FIG. 9) to hold the seal 410 (shown behind the folding snap feature 802 in FIG. 9) in place over the wire leads 712*a-n* extending outward from the back plate 412 and for thereby preventing contaminants from entering the assembly. As a final assembly step, the back plate 412 may be placed into position adjacent the cover 402 as generally shown in FIG. 9, which has the electrode film 404 adhered to a bottom surface 602 thereof, and the back plate 412 may be glued to the cover 402 with the elastomeric connector 408 establishing an electrical connection between the electrodes on the electrode film 406 and the electrodes on the cover 402.

Figure 10:
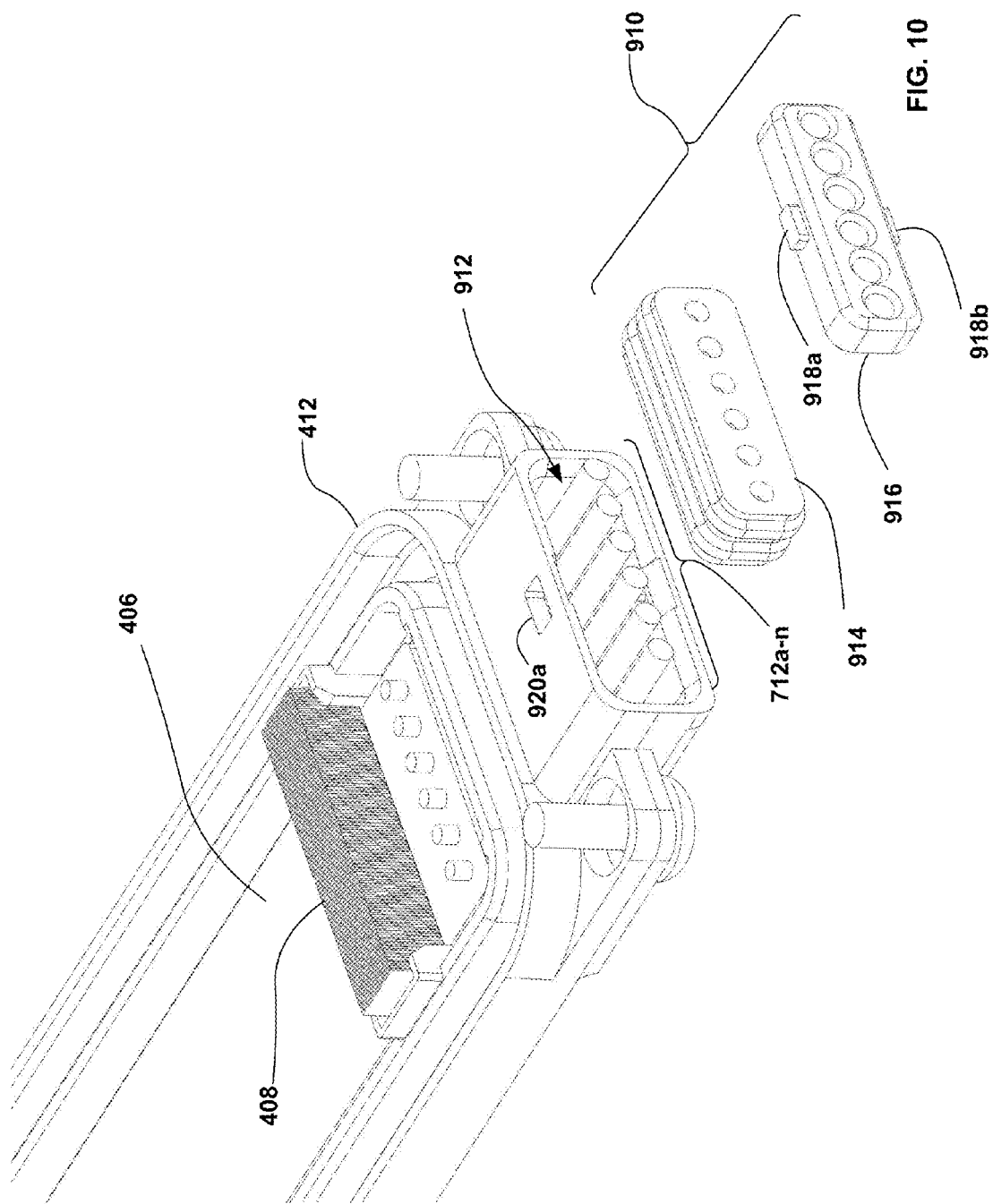
FIG. 10 is a exploded, perspective view of another embodiment of a seal for the plurality of wires coupled to the PCB.
Figure 11:
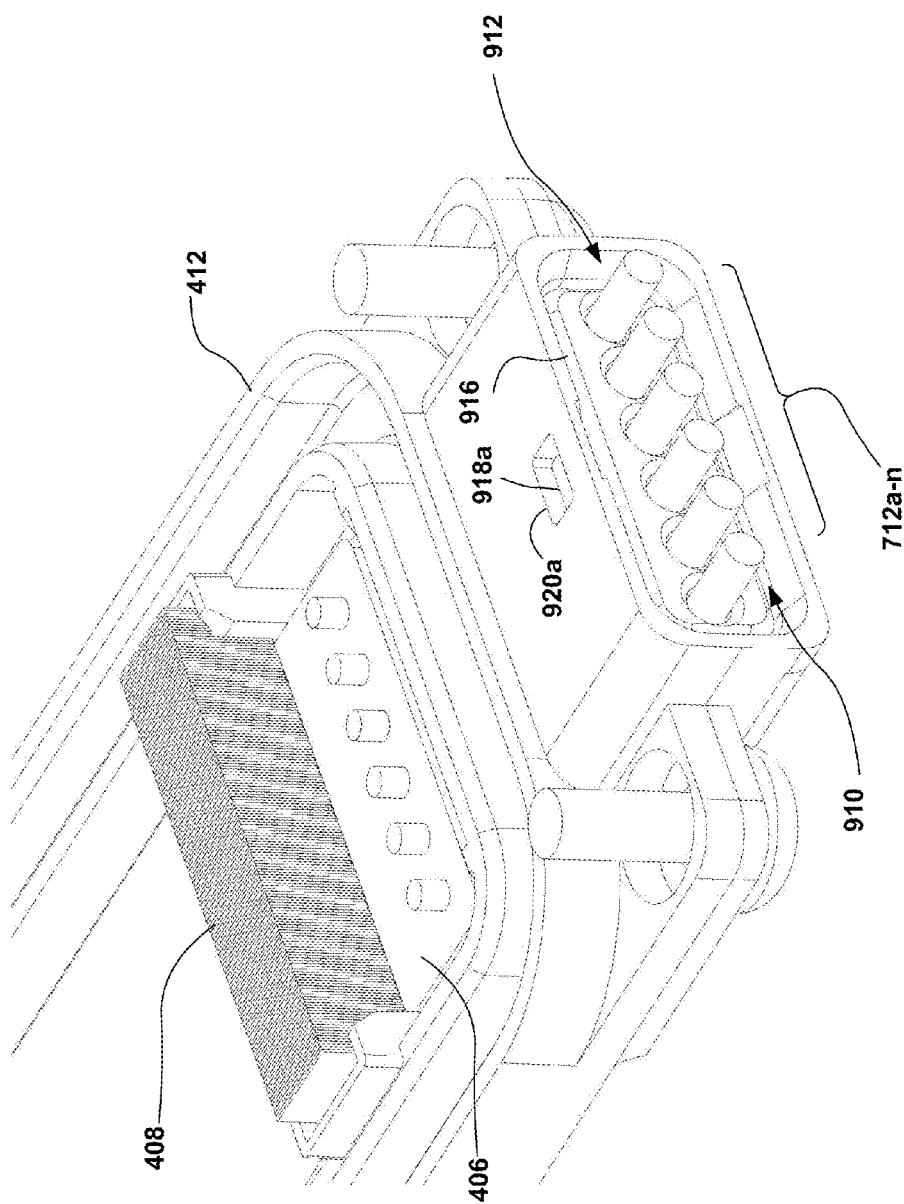
FIG. 11 is an assembled end view of the seal shown in FIG. 10.

Turning now to FIGS. 10-11, another embodiment is generally illustrated wherein the wires 712*a-n* may be sealed using a grommet positioning apparatus (GPA) 910 configured to be at least partially received in a cavity 912 of the back plate 412, for example, as generally illustrated in FIG. 11. As generally illustrated in FIG. 10, the GPA 910 may include a seal or grommet 914 and a retainer or plug 916. The seal 914 may include a non-conductive resilient, flexible material (such as, but not rubber or the like) having at least one opening configured to receive the wires 712*a-n*. The retainer 916 may include a non-conductive, generally rigid material including at least one opening configured to receive the wires 712*a-n*. The retainer 916 may also include one or more protrusions 918*a*, 918*b* configured to engage one or more openings 920*a*, 920*b* disposed in the cavity 912 as generally illustrated in FIG. 11.

Figure 12:
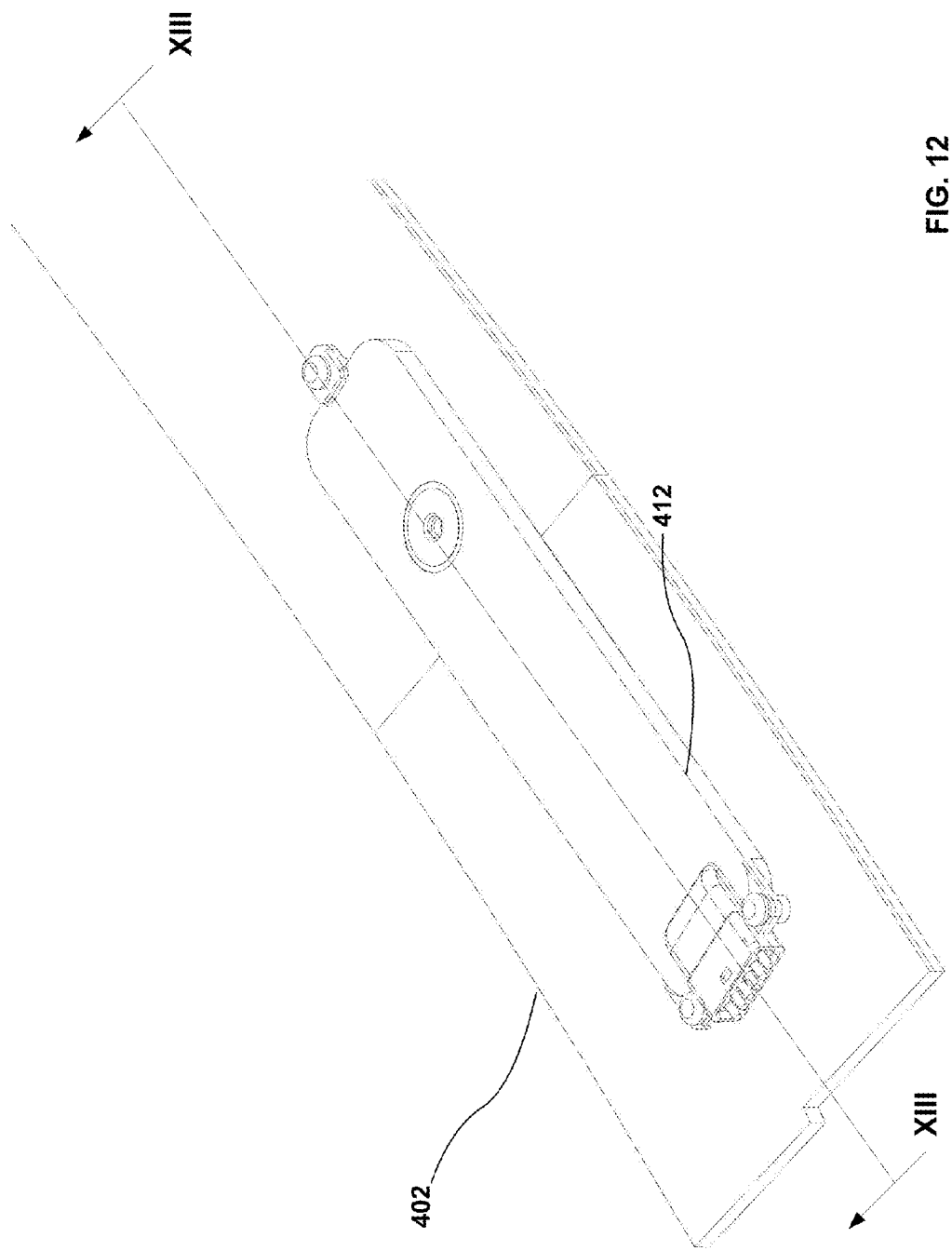
FIG. 12 is a bottom perspective view of the back plate coupled to the cover.
Figure 13:
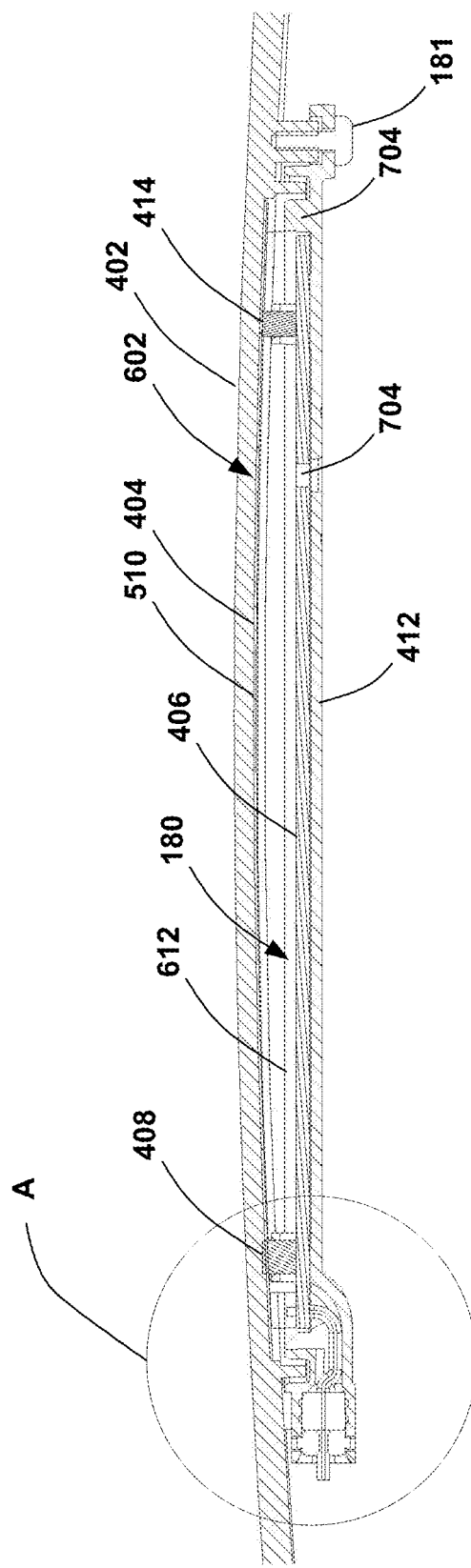
FIG. 13 is a cross-sectional view of the back plate coupled to the cover taken along line XIII.
Figure 14:
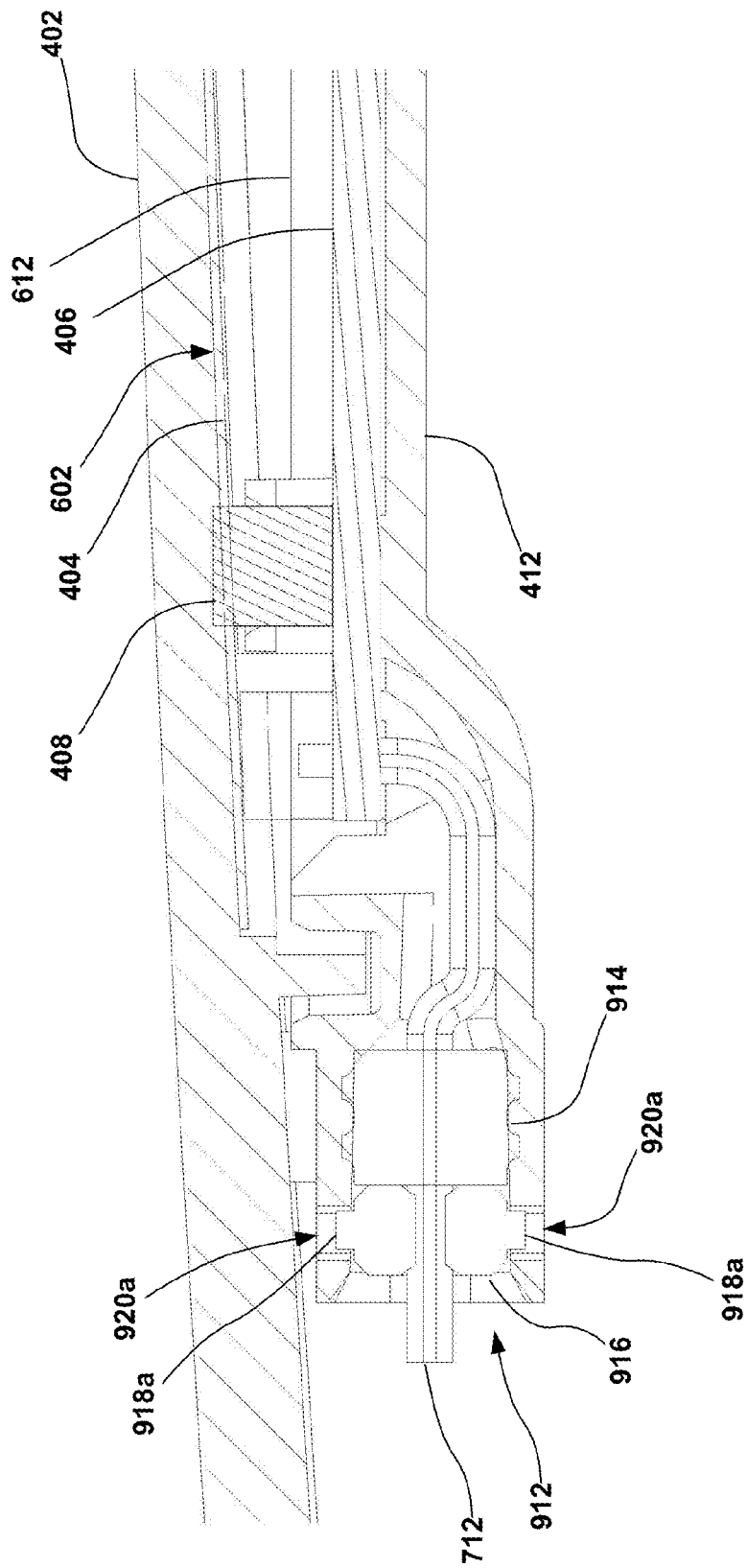
FIG. 14 is a close-up of the section labeled "A" in FIG. 13.

A bottom perspective view of one embodiment of the final assembly is generally illustrated showing the back plate 412 coupled to the cover 402. Turning now to FIG. 13, a cross-sectional view of the assembled sensor of FIG. 12 is shown taken along line XIII. FIG. 14 is a close up of the end region of the sensor shown in FIG. 13 generally denoted by circle A. As may be seen, the inner surface 602 of the cover 402 may be curved. The electrode film 404 may be secured to the inner surface 602 of the cover 402 by the adhesive layer 510, and may therefore generally conform to the curvature of the inner surface 602 of the cover 402. As a result, the electrode film 404 may support multiple applications having different curvatures. In addition, air gaps between the electrode film 404 and the inner surface 602 of the cover 402 may generally be eliminated.

At least a portion of the PCB 406 may be disposed a spaced distance 180 from the electrode film 404 and may be electrically coupled to the electrode film 404 by way of elastomeric connector 408. The PCB 406 may be secured to the back plate 412, for example, using one or more snap connection features 704 or the like. The elastomeric connector 408 and/or the supports 414 may also reduce movement of the PCB 406 relative to the cover 402 and back plate 412 (e.g., due to vibration or the like). Because the PCB 406 does not need to conform to the curvature of the inner surface 602 of the cover 402, the PCB 406 may be made thicker compared to other designs, thereby reducing flex of the PCB 406. The cover 402 and the back plate 412 may be glued, welded, and/or secured together with one or more fasteners 181.

Advantageously, an electrode film construction 404 consistent with the present disclosure may support multiple vehicle lines since the film 404 is flexible to conform to different curvatures of different covers 402. Also, the wire harness is independent of the switch assembly, and the seal is located within the assembly thereby obviating difficulties with potting the seal after assembly. PCB flex may also be eliminated by using a relatively thick PCB to thereby avoid air gaps in the assembly and corresponding performance degradation. The snap in cover is formed integrally with the base to avoid the need for additional parts. The GPA also reduces the number of parts and facilitates assembly. Also, the configuration allows for a relatively thick cover to improve the appearance of the assembly. Dielectric formed by the assembly is minimal thereby allowing improved performance. An anti-swipe electrode may be provided to avoid inadvertent locking. Also, the entire assembly may be produced using a simple and efficient process.

There is provided a device using capacitive touch sensing technology. Electrodes forming the capacitive touch sensors may be formed using a transparent or non-transparent conductive ink applied either directly to the cover or to an electrode film, as described above, to form an electrode pattern. The electrode film may include an adhesive for attaching the film to the cover, or the film may be insert molded to the cover. The film or the backside of the cover may be pained with desired graphics which are illuminated by LEDs. The LEDs may be attached to the PCB located behind the cover at sufficient distance to allow proper light spread for the graphics. Signals from the sensing panel may be transmitted to the PCB through either metal spring contacts or ribbon cable or non-conductive rubber block which is sectioned by metal contacts, an elastomeric contact, as described above, or other methods.

In summary, there is provided a touch sensor assembly. The touch sensor assembly may include a cover, an electrode film assembly, an adhesive layer, a printed circuit board (PCB) electrically connected to the electrode film and a back plate configured to be coupled to the cover with the PCB and the electrode film assembly disposed between the housing and the back plate. The electrode film assembly may include an electrode film formed from a conductive ink and may comprise a plurality of contacts corresponding to a plurality of touch areas. The electrode film assembly may optionally comprise capacitive circuitry configured to exhibit a capacitance response to contact with the touch areas. The adhesive layer may be configured to secure the electrode film assembly to the cover. The PCB may be substantially planar and the cover may include an inner surface having a curvature. The electrode film may be configured to substantially conform to the curvature when secured thereto.

According to another aspect, there is provided a system comprising at least one touch sensor assembly coupled to a vehicle. The touch sensor assembly may be configured to generate at least one signal configured to unlock a door of the vehicle. The touch sensor assembly may include a cover, an electrode film assembly comprising an electrode film formed from a conductive ink and comprising a plurality of contacts corresponding to a plurality of touch areas, an adhesive layer configured to secure the electrode film assembly to the cover, a printed circuit board (PCB) electrically connected to the electrode film and a back plate configured to be coupled to the cover with the printed circuit board and the electrode film assembly disposed between the housing and the back plate.

According to yet another aspect, there is provided a touch sensor. The touch sensor may include an electrode film formed from a conductive ink and comprising a plurality of contacts corresponding to a plurality of touch areas, at least one indicia layer configured to transmit light having a lower surface coupled to an upper surface of the electrode film, at least one generally transparent film having a lower surface coupled to an upper surface of the at least one indicia layer and an adhesive layer having a first surface coupled to an upper surface of the at least one translucent film.

According to yet a further aspect, there is provided a method comprising providing a cover having a curved inner surface and a back plate and providing an electrode film assembly comprising an electrode film formed from a conductive ink and comprising a plurality of contacts corresponding to a plurality of touch areas. The method may also include securing the electrode film assembly to the curved inner surface of the cover wherein the electrode film substantially conforms to the curvature of the inner surface and securing a printed circuit board (PCB) to the back plate. The method may further include electrically connecting the PCB to the electrode film and coupling the back plate to the cover with the printed circuit board and the electrode film assembly disposed between the housing and the back plate.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A touch sensor assembly comprising:
    a cover;
    an electrode film assembly coupled to said cover, said electrode film comprising an electrode film formed from a conductive ink and comprising a plurality of contacts corresponding to a plurality of touch areas;
    a printed circuit board (PCB) electrically connected to said electrode film;
    a back plate configured to be coupled to said cover and define a chamber therebetween, said chamber configured to receive said PCB and said electrode film assembly;
    a plurality of wires electrically coupled to said PCB for transmitting a signal indicative of contact with said touch areas, said plurality of wires extending externally beyond said back plate and through a cavity defined by said back plate; and
    a seal disposed within said cavity configured to seal said plurality of wires to said cavity.

2. The touch sensor assembly of claim 1, wherein there is substantially no air gap between the electrode film assembly and said cover.

3. The touch sensor assembly of claim 1, further comprising at least one light source configured to emit light through at least a portion of said electrode film and said cover for illuminating said touch areas.

4. The touch sensor assembly of claim 1, wherein said electrode film assembly comprises capacitive circuitry configured to exhibit a capacitance response to contact with said touch areas.

5. The touch sensor assembly of claim 1, further comprising an elastomeric connector disposed between said electrode film assembly and said printed circuit board.

6. The touch sensor assembly of claim 5, wherein said elastomeric connector comprises conductive fibers configured to provide electrical contact between electrodes on said electrode film assembly and associated contacts on the PCB.

7. The touch sensor assembly of claim 1, wherein said back plate further comprises a folding snap feature, said folding snap feature configured to bend from a first position wherein said seal may be received into said cavity to a second position in which said folding snap feature is configured to retain said seal within said cavity.

8. The touch sensor assembly of claim 1, further comprises a retainer comprising one or more protrusions configured to engage one or more openings disposed in a sidewall of said cavity, said retainer configured to retain said seal within said cavity.

9. The touch sensor assembly of claim 1, further comprising an anti-swipe electrode configured to prevent inadvertent generation of a signal indicative of contact with said touch areas.

10. The touch sensor assembly of claim 1, wherein said electrode film assembly comprises:
    a first generally transparent film having an upper surface adjacent to an adhesive layer; and
    at least one indicia film having an upper surface adjacent to a lower surface of said first generally transparent film.

11. The touch sensor assembly of claim 10, wherein said adhesive layer is disposed substantially coextensive with said first generally transparent film and wherein said first generally transparent film is disposed coextensive with said at least one indicia film.

12. The touch sensor assembly of claim 10, wherein said at least one indicia film comprises at least two layers having a first and a second different color, respectively.

13. The touch sensor assembly of claim 10, wherein a lower surface of said at least one indicia layer defines an electrode pattern of said conductive ink.

14. The touch sensor assembly of claim 10, further comprising a second generally transparent disposed adjacent to a lower surface of said at least one indicia layer, said second generally transparent defining an electrode pattern of said conductive ink.

15. The touch sensor assembly of claim 1, wherein said PCB is secured to said back plate using at least one fastener.

16. The touch sensor assembly of claim 15, further comprising at least one elastomeric connector disposed within a space extending between and separating said PCB and said electrode film, wherein said at least one elastomeric connector is configured to electrically connect said PCB and said electrode film assembly.

17. The touch sensor assembly of claim 15, wherein said back plate includes at least one locating features configured to engage with corresponding locating features on said PCB to position said PCB within said chamber with respect to said back plate.

18. The touch sensor assembly of claim 17, wherein said locating features include a protrusion and a corresponding opening.

19. The touch sensor assembly of claim 1, wherein said PCB is substantially planar.

20. The touch sensor assembly of claim 19, wherein said cover comprises an inner surface having a curvature, wherein said electrode film is configured to substantially conform to said curvature when secured thereto.

21. A system comprising:
   at least one touch sensor assembly comprising:
      a cover;
      an electrode film assembly comprising an electrode film formed from a conductive ink and comprising a plurality of contacts corresponding to a plurality of touch areas;
      an adhesive layer configured to secure said electrode film assembly to said cover;
      a printed circuit board (PCB) electrically connected to said electrode film;
      a back plate configured to be coupled to said cover and define a chamber therebetween, said chamber configured to receive said PCB and said electrode film assembly such that an air gap is disposed between at least a portion of said PCB and said electrode film assembly;
      a plurality of wires electrically coupled to said PCB for transmitting a signal indicative of contact with said touch areas, said plurality of wires extending externally beyond said back plate and within a cavity defined by said back plate; and
      a seal disposed within said cavity configured to seal said plurality of wires to said cavity.

22. The system of claim 21, wherein said electrode film assembly comprises capacitive circuitry configured to exhibit a capacitance response to contact with said touch areas.

* * * * *